US009201092B2

(12) United States Patent
Behrens et al.

(10) Patent No.: US 9,201,092 B2
(45) Date of Patent: Dec. 1, 2015

(54) APPARATUS AND METHOD FOR TESTING A PLURALITY OF DEVICES UNDER TEST

(75) Inventors: Klaus-Peter Behrens, Stuttgart (DE); Marc Moessinger, Renningen-Malmsheim (DE)

(73) Assignee: ADVANTEST CORPORATION, Tokyo (JP)

( * ) Notice: Subject to any disclaimer, the term of this patent is extended or adjusted under 35 U.S.C. 154(b) by 315 days.

(21) Appl. No.: 13/641,089

(22) PCT Filed: Apr. 14, 2010

(86) PCT No.: PCT/EP2010/054879
§ 371 (c)(1),
(2), (4) Date: May 28, 2013

(87) PCT Pub. No.: WO2011/127973
PCT Pub. Date: Oct. 20, 2011

(65) Prior Publication Data
US 2013/0234723 A1   Sep. 12, 2013

(51) Int. Cl.
*G01R 1/02* (2006.01)
*G01R 31/319* (2006.01)

(52) U.S. Cl.
CPC ............. *G01R 1/02* (2013.01); *G01R 31/3191* (2013.01); *G01R 31/31924* (2013.01)

(58) Field of Classification Search
USPC ............ 324/756.02, 762.01, 750.01, 762.02, 324/750.02, 750.3, 537; 702/108, 117, 118, 702/121; 703/13, 14
See application file for complete search history.

(56) References Cited

U.S. PATENT DOCUMENTS

| 3,976,940 | A  | * | 8/1976  | Chau et al. ...................... 714/736 |
| 5,381,421 | A  | * | 1/1995  | Dickol et al. .................. 714/744 |
| 6,292,415 | B1 | * | 9/2001  | Brehm .......................... 365/201 |
| 6,452,411 | B1 |   | 9/2002  | Miller et al. |
| 6,480,978 | B1 |   | 11/2002 | Roy et al. |
| 2009/0240365 | A1 | | 9/2009  | Nijima et al. |
| 2011/0131000 | A1 | * | 6/2011  | Daub et al. ..................... 702/118 |

FOREIGN PATENT DOCUMENTS

WO       2009/105765       8/2009

* cited by examiner

*Primary Examiner* — Melissa Koval
*Assistant Examiner* — Nasima Monsur (57) ABSTRACT

Embodiments of the invention relate to an apparatus and a method for testing a plurality of devices under test. The apparatus for testing a plurality of devices under test comprises a common device output line and a driver unit configured to provide a stimulus to the DUTs. The driver unit is configured such that the stimulus reaches different DUTs at different times, thereby creating stimuli time shifts at the DUTs. The apparatus further comprises a receiver unit electrically coupled to the common device output line and a plurality of DUTs connections, electrically coupled to the common device output line, so that DUT terminals of the plurality of DUTs are electrically coupleable via the common device output line to the receiver unit. Output signal propagation delays for DUT output signals, propagating from the DUT connections to the receiver unit, are adapted to the stimuli time shift, such that a test of DUTs which have identical stimulus response delays, results in a temporally aligned superposition of the DUT output signals at the receiver unit.

20 Claims, 7 Drawing Sheets

APPARATUS AND METHOD FOR TESTING A PLURALITY OF DEVICES UNDER TEST

CROSS-REFERENCES TO RELATED APPLICATIONS

This application is a Continuation of and claims priority to International Application No. PCT/EP2010/054879, filed on Apr. 14, 2010, titled "APPARATUS AND METHOD FOR TESTING A PLURALITY OF DEVICES UNDER TEST" by BEHRENS, Klaus-Peter and MOESSINGER, Marc which is herein incorporated by reference.

TECHNICAL FIELD

The present disclosure relates generally to the field of automated test equipment and more specifically to the field of testing a plurality of devices under test (DUTs) using automated test equipment.

BACKGROUND

In general components, for example, electronic components or devices, micro-electronic chips, memory chips or other integrated circuits (IC), are usually tested before they are delivered to a customer. Testing may be performed in order to prove and ensure the correct functional capability of the devices. The tests are usually performed by means of an automated test equipment or test system. Examples for such automatic test equipment are the Verigy V93000 SOC for testing system on a chip and system on a package, the V93000 HSM high speed memory tester (HSM) for testing high speed memory devices and the Verigy V5000 series. The first is a platform for testing systems on a chip, systems on a package and high-speed memory devices. The latter is for testing memory devices including flash memory and multi-chip packages at wafer sort and final test.

During testing these devices under test are exposed to various types of stimulus signals from an ATE. The responses from such devices under test are measured, processed and compared to an expected response by the ATE. Testing may be carried out by automated test equipment, which usually performs testing according to a device specific test program or test flow. Such an automatic test system may comprise different drivers for driving certain stimuli to a DUT, in order to stimulate a certain expected response from the device under test. Receiver units of the ATE may analyze the response and may thereby generate a pass-fail information regarding the measured device.

Components or devices that have to be tested may comprise a high number of pins, for example, input and output pins to be tested. Therefore, the number of drivers and receivers which are needed for testing can be high. As a consequence, expenses for such a test system can be high. With a shared driver topology in a test system the number of drivers for testing DUTs can be reduced, since a plurality of DUTs can be driven in a serialized manner by a single driver unit. Therefore, the number of drivers and consequently the costs for testing a DUT can be reduced. So far, the shared driver topology is only applied to input pins of DUTs. Accordingly, a large number of test equipment receivers are required when testing multiple devices.

SUMMARY OF THE INVENTION

Accordingly, a need exists for a tester system that can address the problems with the systems described above. Specifically, there is a need for a system which allows for a further improvement of an ATE resource efficiency when testing multiple devices under test in parallel. For example, there is a need for a system which allows for a reduction of a number of test equipment receivers required for a parallel test of multiple devices. Using the beneficial aspects of the systems described, without their respective limitations, embodiments of the present invention provide a novel solution to address these problems.

An embodiment of the present invention creates an apparatus for testing a plurality of devices under test. The apparatus for testing a plurality of devices under test comprises a common device output line and a driver unit configured to provide a stimulus to the DUTs. The driver unit is configured such that the stimulus reaches different DUTs at different times, thereby creating stimuli time shifts at the DUTs. The apparatus further comprises a receiver unit electrically coupled to the common device output line and a plurality of DUTs connections, electrically coupled to the common device output line, so that DUT terminals of the plurality of DUTs are electrically coupleable via the common device output line to the receiver unit. Output signal propagation delays for DUT output signals, propagating from the DUT connections to the receiver unit, are adapted to the stimuli time shift, such that a test of DUTs which have identical stimulus response delays, results in a temporally aligned superposition of the DUT output signals at the receiver unit.

According to embodiments of the invention a tester system for testing a plurality of devices under test is provided, which comprises a common device output line and a driver unit configured to provide a stimulus to the DUTs. The driver unit is configured such that the stimulus reaches different DUTs at different times, thereby creating stimuli time shifts at the DUTs. The test arrangement also comprises a receiver unit electrically coupled to the common device output line, a plurality of DUT connections electrically coupled to the common device output line and a plurality of DUTs electrically coupled to the DUT connections. Output signal propagation delays for DUT output signals, propagating from the DUT connections to the receiver unit, are adapted to the stimuli time shift, such that a test of the plurality of the DUTs having identical stimulus response delays results in a temporally aligned superposition of the DUT output signals at the receiver unit.

According to further embodiments, a method for testing a plurality of devices under test is disclosed. The method comprises applying a stimulus to DUTs, such that the stimulus reaches different DUTs at different times, thereby creating stimuli time shifts at the DUTs, and such that the DUTs provide temporally shifted DUT output signals in a response to the stimulus. The method further comprises receiving a temporally aligned superposition of the DUT output signals of the DUTs at a receiver unit, wherein the DUTs are electrically coupled via a common output device line to the receiver unit, and wherein output signal propagation delays for the DUT output signals propagating from the DUT terminals to the receiver unit are adapted to the stimuli time shifts, thereby providing for the temporary alignment.

According to embodiments of the invention, a plurality of DUTs may share a common tester receiver unit and, optionally, a common tester driver unit. A common device output line may be configured such that a constructive superposition of DUT output signals, which are shifted among each other by stimuli time shifts, is detectable at the receiver unit which is electrically coupled to the DUTs.

Accordingly, a single receiver unit is sufficient for a quasi-simultaneous (time-shifted, for example, by propagation delay differences along the common device output line) testing of a plurality of devices under test. Accordingly, a single receiver unit may be used to determine, whether a plurality of devices under test provide proper stimulus responses, wherein it is indeed desired (or even necessary) that the stimulus responses of the different devices under test arrive temporally overlapping at the common tester receiver unit. Accordingly, a single common tester receiver unit can be used to decide whether all of the devices under test provide the same stimulus response, wherein a single sampling of the input signal of the common tester receiver unit may be sufficient to provide the decision, and/or wherein the decision, whether all of the devices under test provide the same stimulus response, can be performed within a single bit duration of the stimulus response signals of the devices under test.

Thus, a high resource efficiency can be obtained by using the embodiments of the invention.

The devices under test may be stimulated, for example, using an appropriate stimulus mechanism, such that the stimulus responses of a plurality of devices under test reach the common tester receiver unit approximately at the same time (with a tolerance of, for example, no more than quarter of the duration of a bit for clocked serial bitstream data). Consequently, there is a constructive superposition of the DUT output signals at the common tester receiver unit, if all the devices under test provide identical output signals, which is typically the case for identical and non-defective devices under test. Thus, a well-defined, predicted signal level (e.g. a superposition signal level associated to a common first output signal level of the DUT output signals, or a superposition signal level associated to a common second output signal level of the DUT output signals) may be reached at the input of the common tester receiver unit if all devices under test provide identical output signals, such that it can be concluded from a threshold level decision in the common tester receiver unit that all devices under test provide (at least approximately) identical output signals if the signal at the input of the common tester receiver unit is sufficiently close to one of the well-defined signal levels. In contrast, an intermediate signal level (e.g. between a superposition signal level associated to a common first output signal level of the DUT output signals and a superposition signal level associated to a common second output signal level of the DUT output signals) may be reached at the input of the common tester receiver unit if not all devices under test provide identical output signals, such that it can be concluded from a threshold level decision in the common tester receiver unit that not all devices under test provide (at least approximately) identical output signals if the signal at the input of the common tester receiver unit differs from the well-defined signal levels by more than a predetermined value.

BRIEF DESCRIPTION OF THE DRAWINGS

Embodiments of the present invention will be better understood from the following detailed description, taken in conjunction with the accompanying drawing figures in which like reference characters designate like elements and in which.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature Section

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

With reference to the following description of the embodiments of the present invention, it is to be noted that for simplification reasons, the same reference numerals will be used in the different figures for functionally identical or similarly acting or functionally equal, equivalent elements or steps throughout the description.

Apparatus and Method for Testing a Plurality of Devices under Test

Figure 1:
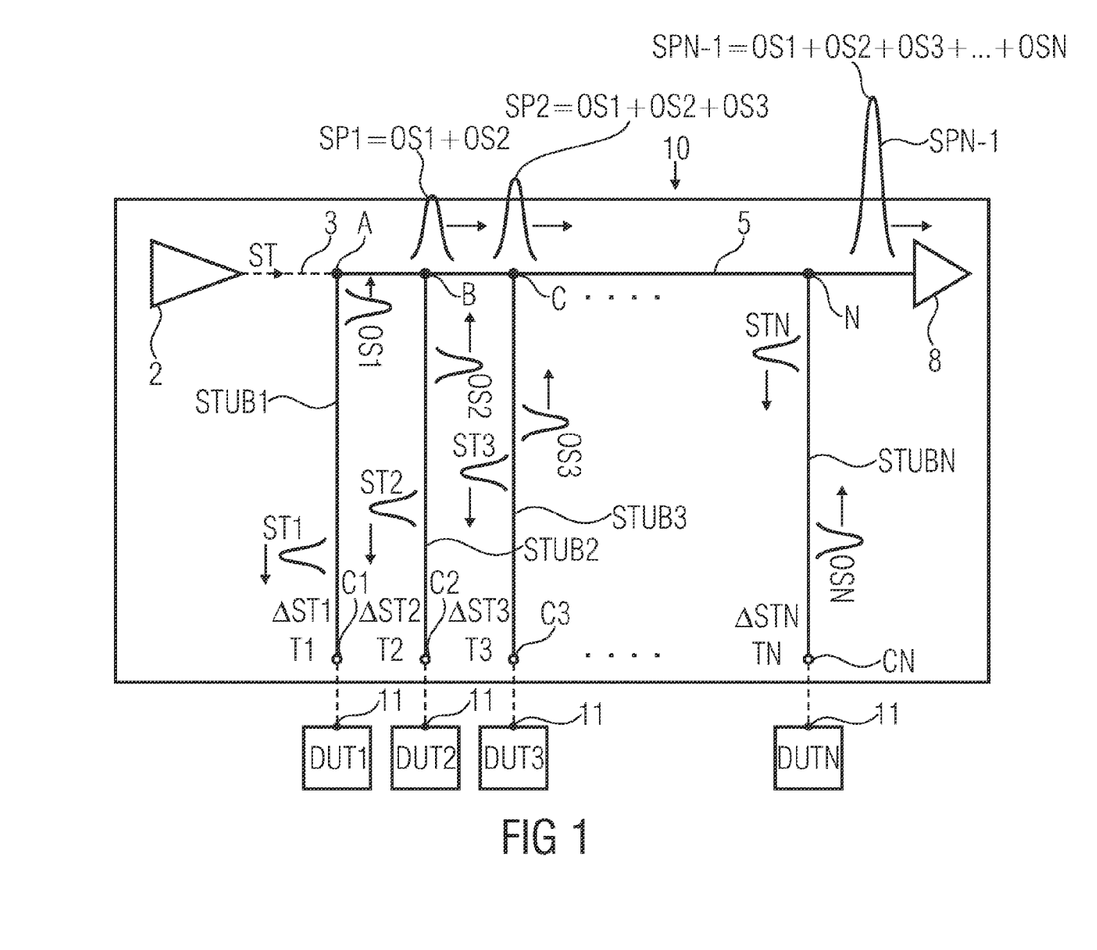
FIG. 1 illustrates a schematic drawing of an apparatus for testing a plurality of DUTs according to an embodiment of the invention.

In FIG. 1, a schematic drawing or circuit diagram of an apparatus for testing a plurality of devices under test (DUTs) according to an embodiment of the invention is shown. The schematic drawing in FIG. 1 is merely for illustrating the inventive concept of the method and the apparatus for testing a plurality of devices under test.

According to embodiments of the invention, the apparatus 10 for testing a plurality of devices under test may comprise a driver unit 2 which is configured to provide a stimulus ST to the DUTs and a common device output line 5. The driver unit 2 is configured such that the stimulus ST reaches different devices under test DUT 1, 2, 3, ..., N at different times T1, T2, T3, ..., TN, thereby creating stimuli time shifts $\Delta ST1$, $\Delta ST2$, $\Delta ST3$, ..., $\Delta STN$ at the DUTs, wherein the stimuli time shifts represent time differences between points in time at which the stimuli arrive at different devices under test. For example, $\Delta STi$ represents a time between a time reference and a point in time at which the stimulus arrives at the i-th device connection. A receiver unit 8 is electrically coupled to the common device output line 5 and, via the common device output line 5, to the plurality of DUT connections C1, C2, C3, ..., CN which are electrically coupled to the common device output line 5. The common device output line 5 may also comprise stubs STUB 1, 2, 3 ..., N which electrically connect corresponding DUT connections with nodes A, B, C, ... N of a main portion of the common device output line 5.

DUT terminals 11 of the plurality of DUTs DUT 1, DUT2, DUT3 ..., DUTN to be tested, can be electrically coupled via the DUT connections and the common device output line 5 to the receiver unit 8. Thereby, output signal propagation delays $\Delta OT1$, $\Delta OT2$, ..., $\Delta OTN$ for DUT output signals OS1, OS2, OS3, ..., OSN propagating from DUT connections C1, C2, C3, ..., CN to the receiver unit 8 are adapted to the stimuli time shifts $\Delta ST1$, $\Delta ST2$, $\Delta ST3$, ..., $\Delta STN$, such that the test of DUTs having identical stimulus response delays, results in a temporally aligned superposition SPN-1 of the DUT output signals OS1, OS2, OS3, ..., OSN at the receiver unit 8. For example, $\Delta OTi$ represents a time between the excitation of a DUT output signal of the i-th device at the DUT connection Ci and the arrival of the DUT output signal at the input of the receiver unit 8. In some embodiments, the relationship $\Delta STj + \Delta OTj = \Delta STk + \Delta OTk$ may hold at least approximately (for example within a tolerance of less than 25% of a bit duration of a DUT signal) for j=1 to N and k=1 to N.

According to embodiments of the invention a plurality of DUTs may share, via a common device output line 5, a common test receiver 8 or test comparator 8. Output terminals of the devices under test DUT1, DUT2, DUT3, ..., DUTN may be electrically coupled via DUT connections C1, C2, C3, ..., CN and the common device output line 5 to the shared receiver unit 8. The output terminals of the DUTS may be, for example, output pins or input- and output (I/O)-pins of DUTs. The DUT connections C1, C2, C3, ..., CN can be configured to electrically connect a device under test with a test system or automatic test equipment (ATE). Upon receiving a stimulus ST1 to STN from the driver unit 2 each device under test may be stimulated to output an output signal OS1, OS2, OS3, ..., OSN.

The DUTs may receive the stimulus ST from the driver unit 2 at different times T1, T2, T3, ..., TN, i.e. time shifted, so that output signals OS1 to OSN provided in response to the received time shifted stimuli are time shifted at the device under test connections as well. The plurality of devices under test may be identical devices, and hence, they may comprise an approximately identical stimulus response delay to a given stimulus, so that the time shift (for example at the device connections) of the outgoing output signals OS1, OS2, OS3, ..., OSN can be predicted. Therefore, if the propagation delay (or, equivalently, the propagation length) of each output signal OS1 ... OSN (e.g. from the respective device under test connection to the receiver unit 8) is adapted to the stimuli time shifts, a temporally aligned superposition SPN-1 of the single output signal OS1, OS2, OS3, ..., OSN can be achieved at the receiver unit 8. If at least one of the DUTs does not work (e.g. respond) as expected or if it comprises a malfunction, the superposition signal SPN-1 at the receiver unit may differ from an expected superposition signal. If the output of all devices is correct, the superposition signal SPN-1 appears with full swing at the ATE's receiver 8. A faulty device may cause a superimposed signal SPN-1 with an "unexpected" superimposed signal characteristic (different from the expected signal characteristic) at the receiver unit. Therefore, a faulty device under test can be detected or at least it can be found (or concluded) that one of the tested devices is faulty. An "unexpected" superimposed signal SPN-1 may have, for example, a signal level which is too high or too low when compared to the expected superimposed signal. The "unexpected" superimposed signal SPN-1 may comprise a time shift or "wrong" timing compared to an expected superimposed signal. It may comprise an unwanted high jitter, an unwanted high noise, a wrong logical level, or it may comprise, in general, an unexpected signal height and/or unexpected signal shape and/or unexpected signal duration.

Optionally, clock signals may be provided to the devices under test DUT1 to DUTN. This is recommendable for devices which are adapted such that device responses are triggered by such a clock signal. In this case, the clock may be aligned with the drive signal or stimulus signal, either by a similar sharing structure (for example, similar to the one used for providing the stimulus ST to the DUTs) or by setting the timing (for example, of separate clock signals) accordingly.

Figure 2:
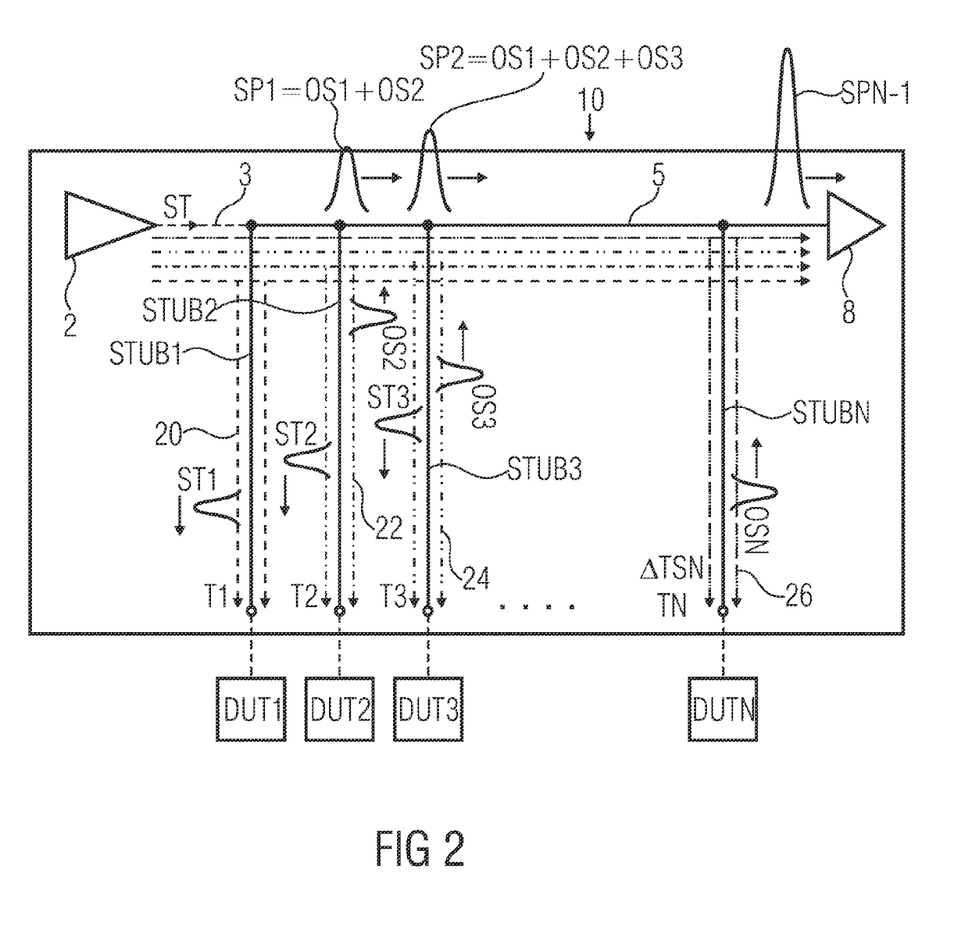
FIG. 2 illustrates a schematic drawing of an apparatus for testing a plurality of DUTs using the inventive apparatus according to an embodiment of the invention.

In the following the principal function of the apparatus 10 for testing a plurality of devices under test according to an embodiment is described in more detail. Notably, FIG. 2 shows an embodiment in which the device output line 5 is shared both for providing the stimulus to the DUTs and for forwarding the DUT responses to the receiver unit.

A driver unit 2 is configured to provide a stimulus ST to the DUTs. The driver unit may couple a stimulus ST via the common device output line 5 to each of the DUTs. In this case, the common device output line 5 may be a common input-and-output line 5, i.e. input signal and output signals make use of the same electrical line or transmission line. Such an input signal may represent, for example, a read command or address information sent to a memory chip upon which the read data are output to the receiver 8. In alternative embodiments the driver unit 2 is not coupled to the DUTs via the common device output line 5, but may be coupled via a common device input line (not shown in FIG. 1 and FIG. 2) to each of the DUTs. This means, the stimulus ST may be coupled, time shifted, via a second electrical line or transmission line to each DUT. The dashed line 3 in FIG. 1 illustrates these two possibilities. In both cases, the driver unit 2 is configured such that the stimulus ST reaches different DUTs DUT1, DUT2, DUT3, . . . , DUTN at different times T1, T2,T3, . . . , TN.

A signal or a stimulus ST propagating from the driver unit 2 to each of the DUTs may split off at the node A in a first part which is continuing to travel to DUT2, DUT3, . . . , DUTN and a second part which is traveling along the STUB1, e.g. in case of a common input/output device line 5, in the direction towards the DUT connection C1. DUT 1 may be electrically coupled via DUT terminal 11 to DUT connection C1 so that DUT1 receives the stimulus ST (or, more precisely, a part of the stimulus signal energy) from the receiver unit 5.

It should be noted that a third part of the stimulus ST may be reflected at the node A (and the remaining nodes) if the characteristic impedance of the transmission line 5 varies. At node B the remaining stimulus signal ST (e.g. the "first part" of the stimulus energy) may split off again into a first part which is continuing to propagate to DUT3, . . . , DUTN and a second part, which is propagating along STUB2 in direction towards DUT connection C2, which may be electrically connected via a DUT terminal to the DUT2. Accordingly, the stimulus ST (or, more precisely, parts of the stimulus signal energy thereof) arrives at different DUT connections at different times. Thus, a stimuli time shift $\Delta ST2-\Delta ST1$ is created between the stimulus ST1 (or stimulus portion) which is propagating to the DUT1 and the stimulus (or stimulus portion) ST2 which is propagating to the DUT2. The stimulus (or stimulus portion) ST2 has to propagate a longer distance to reach DUT2 compared to stimulus (or stimulus portion) ST1 which travels only a shorter distance to DUT1. In this case the stimuli time shift $\Delta ST2-\Delta ST1$ may be given by the propagation length, propagation delay or run time difference for the stimulus between the nodes A and B, if the propagation length of the stubs STUB1 and STUB2 is equal or identical. Generally speaking, the stimuli time shift $\Delta ST2-\Delta ST1$ may depend on the difference between the propagation length of the stimulus ST from the driver unit 2 to the DUT connection C2 and the propagation length of the stimulus ST from the driver unit 2 to the DUT connection C1. The stimulus (or stimulus portion) ST 1 may reach DUT 1 at a time T1 which is earlier than a time T2 at which the stimulus (or stimulus portion) ST2 reaches DUT2, i.e. T2>T1.

In the same way, as described above, the stimulus ST (or a residual energy of the stimulus ST reaching node C) may split off again at the node C, wherein a first part of the stimulus continues to travel to the DUT4, . . . , DUTN and a second part propagates along the stub STUB3 to the DUT3. The stimulus time shift $\Delta ST3-\Delta ST2$ between stimuli ST2 and ST3 may be dependent on the propagation length for the stimulus ST between the nodes C and B, if the propagation lengths of STUB 2 and STUB 3 are identical. Then, the stimuli time shift between DUT1 and DUT3 may be given by $\Delta ST1+\Delta ST2$. The stimulus ST may continue to propagate until finally the stimulus STN reaches the DUT-connection CN (or the device-under-test DUTN) at a time TN with a stimulus time shift $\Delta STN-\Delta STN-1$ compared to DUTN-1.

According to this illustrative embodiment the driver unit 2 is configured to provide a stimulus ST to the DUTs such that the stimulus reaches different DUTs at different times, thereby creating stimuli time shifts at the DUTs. First, the stimulus ST may reach the DUT1 at time T1, then DUT2 at time T2, then DUT3 at time T3 and so on, until it reaches last DUTN at time TN, wherein the following time relation may be valid TN>TN-1, . . . , T3>T2>T1.

If the devices under test DUT1, DUT2, DUT3, . . . , DUTN, are, for example, identical and, therefore, have an identical stimulus response delay, the output signals OS1, OS2, OS3, . . . , OSN provided in response to a stimulus ST comprise a defined time shift as well. Since the stimulus ST from the driver unit (or a stimulus portion ST1 excited by the stimulus ST) reaches first the DUT1, the response or output signal OS1 from the DUT1 is also first propagating along STUB1 in direction to node A on the common device output line 5. Delayed by the stimuli time shift $\Delta ST2-\Delta ST1$, the stimulus portion ST2 reaches the DUT2. If both, DUT1 and DUT2 comprise an (at least approximately) identical stimulus response delay, the output signal OS2 from the DUT2 (at the device connection C2) may be delayed compared to the output signal of the DUT1 (at the device connection C1) by the stimuli time shift $\Delta ST2-\Delta ST1$. At node B, however, a temporally aligned superposition SP1 of the DUT output signals OS1 and OS2 (SP1=OS1+OS2) may develop, as it is schematically shown in FIGS. 1 and 2. Since the output signal OS1 (at the device connection C1) has a time lead of $\Delta ST2-\Delta ST1$ compared to the output signal OS2 (at the device connection C2), but a longer propagation length to node B, which corresponds to the time duration of $\Delta ST2-\Delta ST1$, a temporally aligned superposition SP1 of the output signals OS1 and OS2 may be achieved at node B. In other words, there may be a constructive superposition of the signal components OS1 and OS2 at the node B.

At node C, a temporally aligned superposition SP2 of the combined output signals OS1+OS2 and the output signal OS3 of DUT3 may result. Subsequently all other output signals may be superimposed, temporally aligned until the last output signal OSN of DUTN overlaps at the final node N to form the temporally aligned superposition SPN-1 which comprises the added single output signals OS1 to OSN. As a consequence, a temporally aligned superposition SPN-1 of the DUT output signals of the DUT1 to DUTN arise at the receiver unit 8. In order to achieve a temporally aligned superposition of the DUT output signals at the receiver unit 8 the output signal propagation delays for the DUT output signal OS1 to OSN, which are propagating from corresponding DUT connections C1-CN to the receiver unit 8, may be adapted to the stimuli time shifts $\Delta ST1$ to $\Delta STN$.

It should be noted that according to some embodiments the stimulus ST (and/or a clock signal) may be driven to the DUTs on a separate common device input line, which is not shown in FIG. 1 and FIG. 2. According to other embodiments the stimulus ST (and/or a clock signal) may be driven to the respective DUTs on a common input-and-output device line 5. Nevertheless, in any embodiments, the driver unit 2 may be configured to provide a stimulus (and or a clock signal) to the DUTs such that the stimulus (and/or the clock signal) reaches different DUTs at different times, thereby creating stimuli time shifts (and/or clock time shifts) at the DUTs.

The propagation length of a signal or a stimulus may be, for example, affected by the size, shape and material used for the electrical trace or transmission line between the driver unit and the DUTs and between the DUTs and the receiver unit 8.

As it is schematically shown in FIG. 2, according to an embodiment, a sum of a first propagation length, from the driver unit 2 to the corresponding DUT connection C1 to CN and of a second propagation length, for DUT output signals propagating from the DUT connection C1-CN of the respective DUT to the receiver unit 8, is identical for all of the plurality of devices under test, or within a tolerance range of, e.g., ±5%, ±3%, ±1% or ±0.1%.

According to this embodiment the sum of physical or electrical trace lengths or the transmission line lengths for a signal propagating from the driver unit to a DUT and for an output signal propagating from the DUT to the receiver unit, may be physically identical within the above mentioned tolerance range. This is schematically illustrated in FIG. 2. There, a sum of a first propagation length and a second propagation length for a signal traveling along the dashed line 20 to the DUT1 and a second propagation length for a response signal traveling along the dashed line 20 from the DUT1 to the receiver unit 8 may be identical, within the above mentioned tolerance range, to the sum of a first propagation delay for a stimulus propagating to the DUT2 along the dashed line 22 and a second propagation delay for an output signal propagating from the DUT2 to the receiver unit 8 along the dashed line 22.

The same may be true for a sum of a first propagation length of a stimulus signal and a second propagation length for response signal travelling along the dashed line 24 and for the sum of propagation lengths of a stimulus signal and a response signal travelling along the dashed line 26 for DUT3 and DUTN. This is schematically shown by the different lines, dashed line 20, dashed point line 22, dashed line 24 with two points and dashed line 26 with three points. This means, the propagation lengths of the transmission paths 20, 22, 24 and so on, up to transmission path 26, are identical, so that a temporally aligned superposition of the DUT output signals at the receiver unit can be achieved.

In other words, the run time of stimulus ST to each of the DUTs and the run time of the output signal of the respective DUTs to the receiver unit 8 may be adapted so that a temporally aligned superposition of the DUT output signals can be achieved at the receiver unit.

The receiver unit or comparator unit 8 may be configured to compare the value of the temporally aligned superposition output signals SPN-1 of the DUTs with an expected value or one or more threshold values. Based on the comparison it can be determined whether at least one of the DUT1-DUTN is faulty, i.e. is malfunctioning. A DUT which comprises a failure or which is not working correctly may, for example, output, in response to the received stimulus ST, an erroneous output signal resulting in a temporally aligned superposition of the DUT output signals at the receiver unit, which is different from an expected or predetermined temporally aligned superposition SPN-1, indicating that at least one DUT is faulty. Such an incorrect or wrong output signal may be, for example, an output signal representing a wrong logical level, an output signal having a timing different from a timing of a correctly working DUT, or an output signal with an incorrect output signal height, with an unexpected high noise or unwanted high jitter.

According to embodiments, the receiver unit 8 is configured to compare the temporally aligned superposition SPN-1 of the DUT output signals with a predetermined low threshold value and a predetermined high threshold value at the same time. In other embodiments, the receiver unit 8 may be configured to compare the temporally aligned superposition SPN-1 of the DUT output signals in temporally subsequent cycles with a predetermined low threshold level and with a predetermined high threshold level. This means, according to embodiments, the receiver unit 2 may comprise one or more comparator circuits or units configured to compare the received superposed output signal SPN-1 with a predetermined value with respect to its timing, its signal level, noise, jitter, logical level, etc.

Furthermore, the receiver unit 8 may be configured to output a fail signal, if at least one DUT signal from one of the plurality of DUTs which are tested does not contribute to the temporally aligned superposition in a predetermined manner, such that the test of DUTs having identical stimulus response delays results in an unexpected (temporally aligned) superposition SPN-1 of the DUT output signals. This means, if one of the DUTs which is tested with the inventive apparatus outputs an output signal which differs from an expected output signal in response to the stimulus received from the driver unit, then a failure signal may result, indicating that at least one DUT of the tested DUTs does not work correctly.

According to embodiments, the common device output line 5, which may include STUB1 to STUBN, can be configured such that arrival times of the DUT output signals, which are shifted relative to each other by the stimuli time shifts, differ at the receiver unit among each other by less than a period duration of the DUT output signals.

This means, that, in the temporally aligned superposition SPN-1 of the DUT output signals, the timing of the DUT output signals at the receiver unit may differ by less than the bit duration of the output signals of the measured devices. According to embodiments of the invention, the output signals OS1-OSN may be analog output signals or digital output signals comprising a certain bit rate, bandwidth or frequency.

Therefore, the common device output line 5 may be configured such that the output signals of the different DUTs are not shifted, at the receiver 8, by more than half of the period time of the output signals if the stimulus reaches the DUT in a time-shifted way. The output signals may have a certain data rate or clock frequency and a certain specified rise time, for example a T10/90 or T20/80 rise time. Thereby, the rise time T10/90 (T20/80) may be defined as time difference between an instance in time when a step response crosses the 10% (20%) threshold and an instance in time when the step response reaches 90% (80%) of its final value.

The devices under test which are tested with the inventive apparatus and method may be electronic devices comprising output signals with a frequency in the range, for example, between 1 MHz to 40 GHz, between 500 MHz to 20 GHz or between 1 GHz to 10 GHz, or with an output data rate between 1 Mbit/s and 10 GBit/s.

According to embodiments, the common device output or input-and-output line 5 is configured such that a constructive superposition of the DUT output signals, which are shifted relative to each other by the stimuli time shifts, is detectable at the receiver unit. Therefore, the common device output line 5 may comprise a certain physical length, a certain shape, a certain material or it may be integrated in a certain printed circuit board (PCB) or environment, which may influence the propagation of the stimuli and/or the output signals of the DUTs.

The common device output line 5 and the receiver unit 8 may be configured such that digital levels of the DUT output signals provide added DUT output signal levels at an input of the receiver unit in a temporally aligned way. This means, the temporally aligned superposition SPN-1 may comprise added DUT digital output signal levels at the input of the receiver unit 8, wherein the added DUT digital output signals are temporally aligned. The digital output signal alignment may be within the duration of one bit of such a digital signal, and a possible deviation may, for example, be smaller than a T10/90 or T20/80 rise time of such a bit.

In embodiments a common device output line 5 may be configured such that for DUTs, which have identical stimuli response delays, the individual DUT contributions of the temporally aligned superposition SPN−1 of the DUT signals at the receiver unit have a temporal deviation from each other of less than the bit duration of the DUT output signals.

Figure 3:
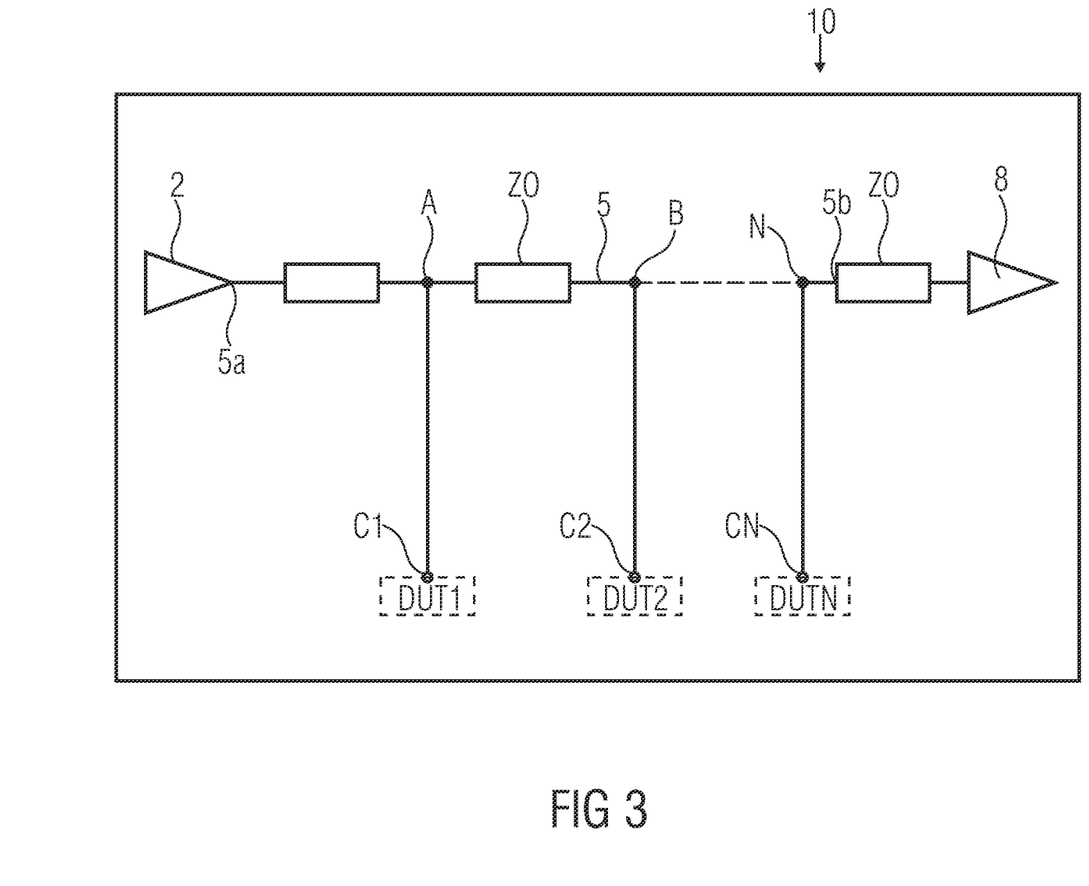
FIG. 3 illustrates a schematic drawing of an apparatus for testing a plurality of DUTs according to an embodiment of the invention.

In FIG. 3, a schematic drawing of an apparatus 10 for testing a plurality of devices under test according to another embodiment is depicted. In this embodiment, the driver unit 2 and the receiver unit 8 are configured to be shared by a plurality of devices under test DUT1, DUT2, . . . , DUTN. In embodiments of the invention, the common device output line 5 may be configured to propagate the stimulus ST from the driver unit 2 to the DUT connection C1, C2, . . . , CN.

In this case common device output lines may be a common device input-and-output line 5. Respective input/output pins or terminals of DUT1 to DUTN may be electrically coupled to the corresponding DUT connections C1 to CN. This means a plurality of DUTs are coupleable via a common device input/output device line 5 to the driver unit 2, as well as to the receiver unit 8.

It should be noted that in an ATE test environment the signal propagating from a tester driver 2 to a DUT driver/receiver and from the DUT to the tester receiver may be disturbed by capacitive and inductive parasitic components or effects. Such parasitic effects may be caused by the propagation path itself or by other components. A stimulus, which is traveling from a tester driver to a DUT and from the DUT to the tester receiver unit may be affected by the capacitive and inductive components of a termination circuitry, the tester channel, an interface board, a socket/a probe or a package of the DUT.

As is schematically shown in FIG. 3, a common device output line 5 may be described with the characteristic impedance ZO. The characteristic impedance ZO may be determined by the size, shape and material used for the common device output line. The characteristic impedance is at least approximately frequency-independent and constant. The common device output line 5 may be a transmission line comprising two or more conductors, which are insulated against each other by some dielectric material, which may be, for example, air or another dielectric material. When a signal on a transmission line arrives at some point where a characteristic impedance changes, only a part of the signal will pass, whereas the rest will be reflected back. A transmission line may comprise a uniform cross section which may avoid reflections of a signal or stimulus and may furthermore comprise a well defined and homogenous capacitance and inductance per unit length. A transmission line may act to transfer electrical signals from one place, e.g. the driver unit, to another place, e.g. the DUTs. A stimulus signal and an output signal from a DUT device may be reflected, for example, at the nodes A, B, . . . , and N. Each time a reflected wave is superimposed onto the voltage that is currently present on the transmission line, such reflected signals may travel back to the beginning of the transmission line, where the same can be reflected again, or absorbed in a termination.

The driver unit 2 and the receiver unit 8 may be coupled via a common device input-and-output line 5 to the plurality of DUTs. This means, a shared test driver and test receiver topology is achieved, so that the number of receivers and drivers in a test system can be reduced and hence, the test costs and tester costs can be reduced. The common device output line 5 may be configured as a common device input-and-output line, which is electrically coupled to the driver unit 2 at the first end 5a and to the receiver unit 8 at the second end 5b of the common device input-and-output line, so that the driver unit 2 provides stimulus via the common device input-and-output line 5 to the DUT connections and DUT output signals propagate from the DUT connections via the common device input-and-output line 5 to the receiver unit 8.

Figure 4:
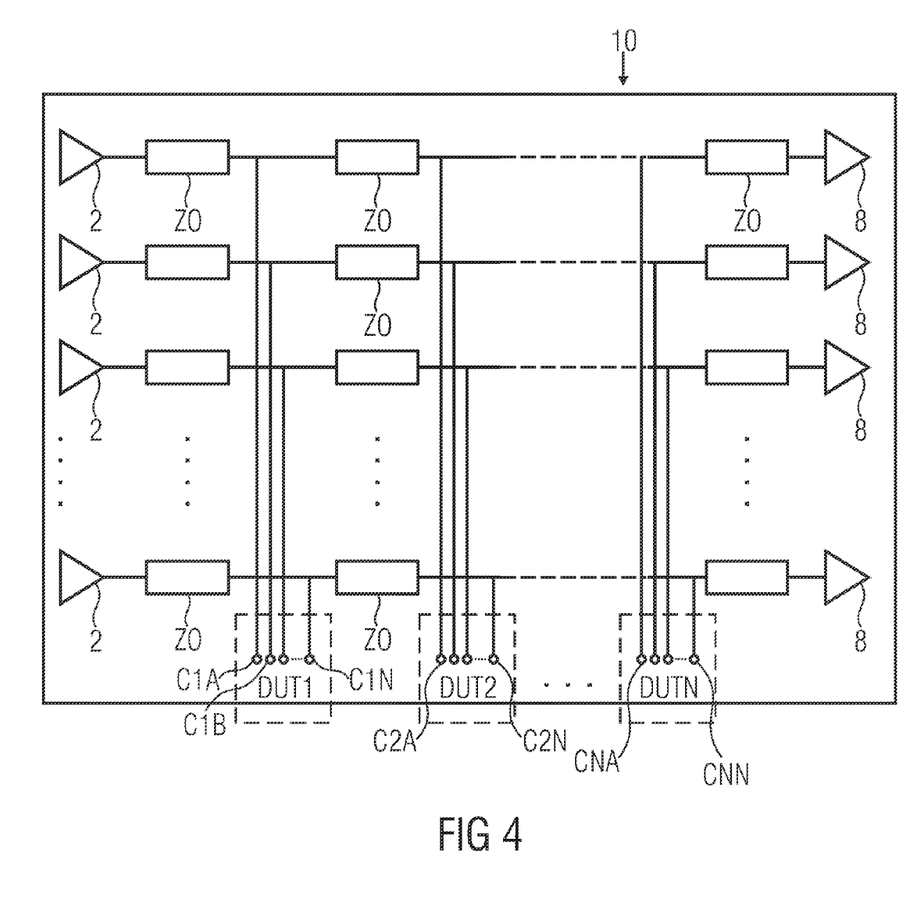
FIG. 4 illustrates a schematic drawing of an apparatus for testing a plurality of DUTs having a plurality of drivers and receivers, according to an embodiment of the invention.

As it is schematically shown in FIG. 4, an apparatus 10 for testing a plurality of devices under test may comprise a plurality of driver units 2 and a plurality of receiver units 8, which are configured to be shared by the plurality of DUTs. This means, an apparatus may comprise a plurality of driver units which are connected via respective DUT connections, for example, C1A, C1B to C1N, C2A to C2N and CNA to CNN to input/output pins of respective DUTs. Each of the input/output pins of the DUTs may be connected via the corresponding common device output line 5 to the receiver unit 8.

According to embodiments, a plurality of DUTs can be tested in a daisy chain type method with a common device output line 5 or input/output line 5, i.e. in a serialized (but approximately parallel) way, so that the number of test channels and test receiver units can be reduced compared to test systems comprising only shared drivers, but no shared test receivers 8.

Figure 5:
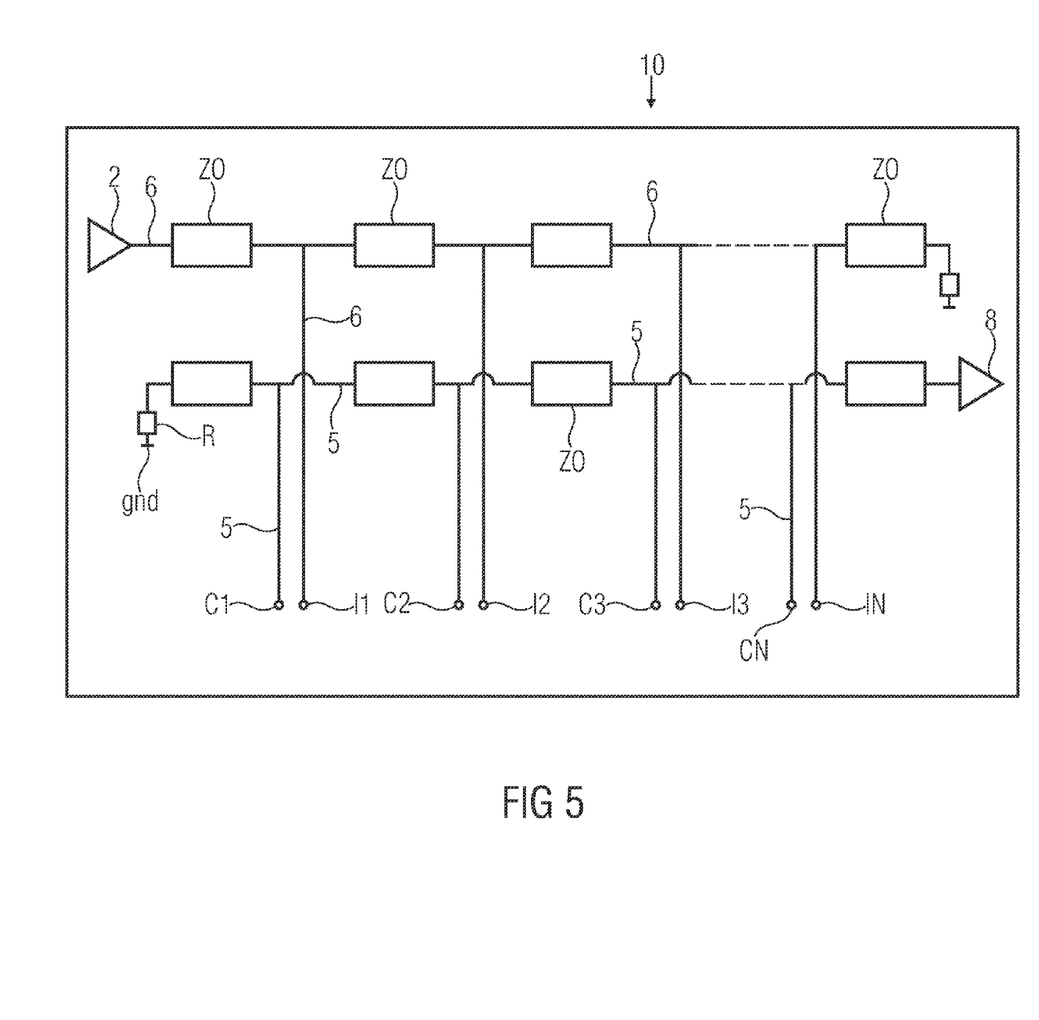
FIG. 5 illustrates a schematic drawing of an apparatus for testing a plurality of DUTs according to another embodiment of the invention.

In FIG. 5, an apparatus for testing a plurality of devices under test is schematically depicted. According to embodiments an apparatus 10 for testing a plurality of devices may further comprise a common device input line 6, which is electrically coupled to the driver unit 2 and wherein the driver unit is configured to provide the stimulus ST via the common device input line 6 to a plurality of input DUT connections I1, I2, I3, . . . , IN, to which input DUT terminals of the plurality of DUTs are electrically coupleable. This means that according to embodiments, the stimulus ST is not sent via the same electrical line or transmission line to the corresponding DUT, via which an output signal triggered by the stimulus ST is propagating to the receiver unit 8. According to examples, the driver unit 2 is configured to be shared, via a common device input line 6, by the plurality of DUTs and the receiver unit 8 is configured to be shared, via the common device output line 5, by the plurality of DUTs. The electrical line or transmission line may again be described by means of a characteristic impedance ZO. The common device output line 5 and the common device input line 6 may each be coupled via corresponding termination resistors R to a ground potential in order to suppress possible signal reflections.

Figure 6:
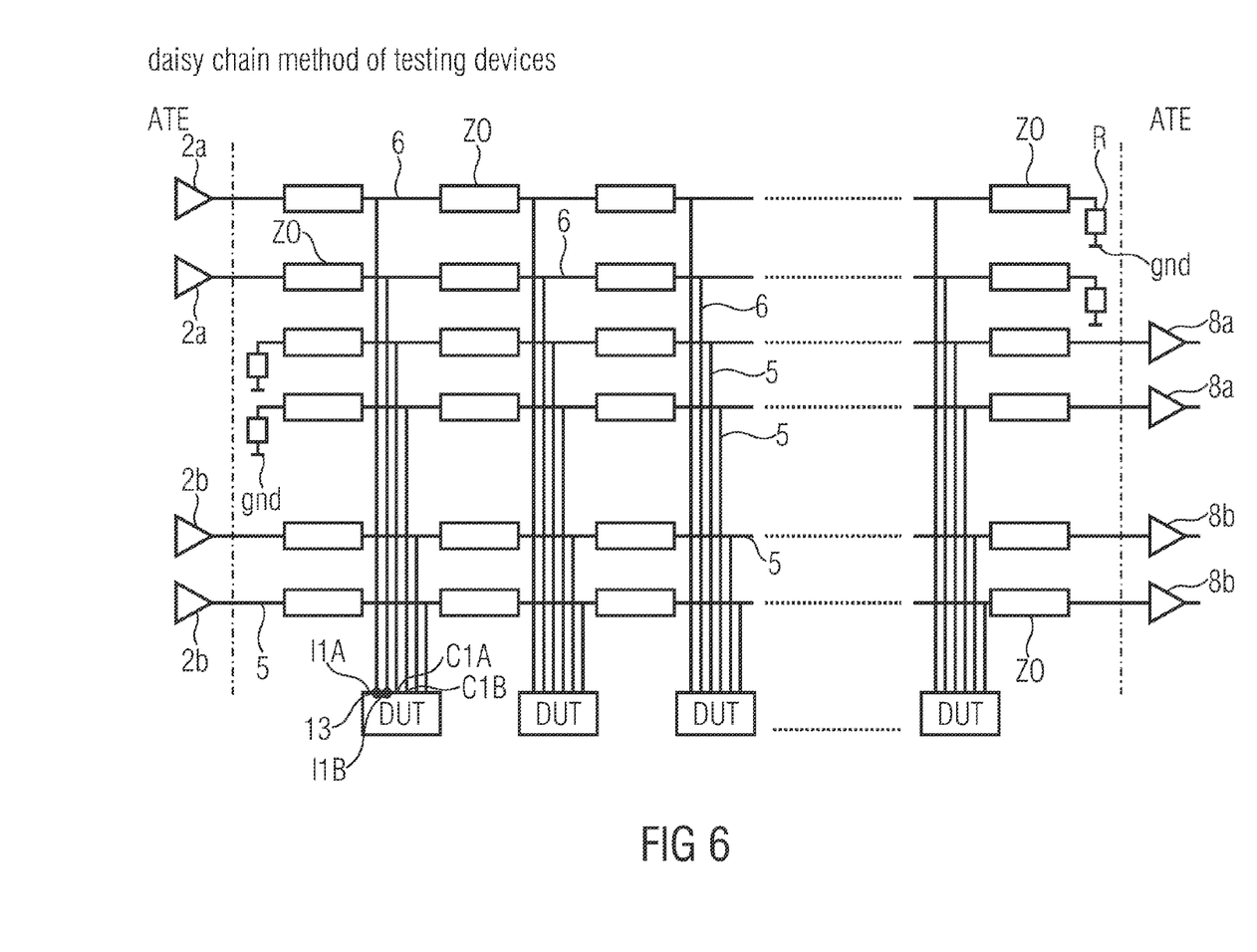
FIG. 6 illustrates a schematic drawing of an apparatus for testing a plurality of DUTs comprising a shared tester driver topology and a shared tester receiver topology, as well as a tester driver/receiver shared topology for DUTs according to embodiments of the invention.

In FIG. 6, a schematic drawing of an apparatus 10 for testing a plurality of devices under test using such a "daisy chain" method of testing devices, as described above, is shown. The apparatus may comprise a plurality of driver units 2a wherein each driver unit 2a is coupled via a common device input line 6 to an input DUT connection I1A, I1B etc., and consequently to a plurality of DUT input terminals 13 or pins of a DUT to be tested. Each of the common device input lines 6 may comprise or may be described by a certain characteristic impedance ZO, and it may be coupled via a resistor R to a potential, e.g., a ground potential gnd. Furthermore, the apparatus may comprise a plurality of receiver units 8a or comparator units, each of them coupled via a shared common device output lines 5 to DUT connections C1A, C1B, etc., and wherein each of the common device output line 5 may comprise a termination resistor R to a potential, e.g. the ground potential gnd.

According to this embodiment, the apparatus 10 may comprise driver units 2a and receiver units 8a wherein each of them is coupled via a corresponding common device output line 5 or a common device input line 6 to DUT connections I1A, I1B, C1A, C1B, . . . etc. Therefore, a driver unit 2a and a receiver/comparator unit 8a of the inventive apparatus can be used for testing a plurality of DUTs in a "daisy chain" configuration.

According to the embodiment discussed here, a test arrangement is disclosed for testing a plurality of devices under test, wherein the test arrangement comprises a common device output line 5 and a driver unit 2 configured to provide a stimulus to the DUTs, wherein the driver unit is configured such that the stimulus reaches different DUTs at different times, thereby creating stimuli time shifts at the DUTs. Moreover, the test arrangement may comprise a receiver unit 8 which is electrically coupled to the common device output line 5 and, via the common device output lines, to a plurality of DUT connections C1 to CN, which are electrically coupled to the common device output line and, consequently, to a plurality of DUTs electrically coupled to the DUT connections, wherein output signal propagation delays for DUT output signals, propagating from the DUT connections to the receiver unit are adapted to the stimuli time shifts, such that the test of the plurality of DUTs having identical stimulus response delays results in a temporally aligned superposition of the DUT output signals at the receiver unit. According to embodiments of the test arrangement, the common device output line and the receiver unit are configured such that digital levels of the DUT output signals provide added digital signal levels at the input of the receiver unit in a temporally aligned way.

Figure 7:
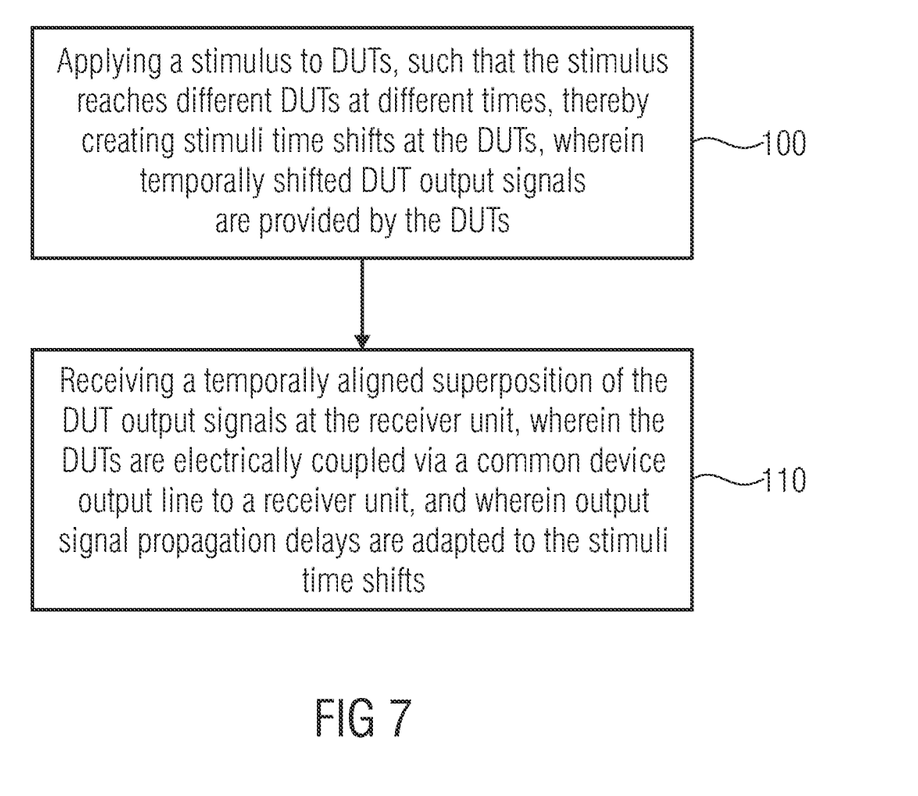
FIG. 7 illustrates a flow chart of the method for testing a plurality of DUTs according to an embodiment of the invention.

FIG. 7 shows a schematic flow chart of a method for testing a plurality of devices under test according to an embodiment. At block 100, the method comprises applying a stimulus to DUTs, such that the stimulus reaches different DUTs at different times, thereby creating stimuli time shifts at the DUTs, and such that the DUTs provide temporally shifted DUT output signals in response to the stimulus. Furthermore, at block 110, the method comprises receiving a temporally aligned superposition of the DUT output signals of the DUTs at the receiver unit, wherein the DUTs are electrically coupled via a common device output line to the receiver unit, and wherein output signal propagation delays for the DUT output signals propagating from the DUT terminals to the receiver unit are adapted to the stimuli time shifts, thereby providing for the temporal alignment.

According to the inventive method, the stimulus is applied to different DUTs at different times, so that the stimulus reaches the DUTs with a certain time difference or stimuli time shift compared to other DUTs. As a consequence, if the DUTs have identical stimulus response delays, temporally shifted output signals are provided at the DUT outputs or DUT input/outputs in response to the temporally shifted stimulus.

A further step of the inventive method comprises receiving at block 110 a temporally aligned superposition of the DUT output signals at the receiver unit. The DUTs are electrically coupled via a common output device line to the receiver unit. The output signals from the DUT are temporally shifted at the DUT connections because of the stimuli time shifts of the stimulus. In order to receive a temporally aligned superposition of the DUT output signals, output signal propagation delays for the DUT output signals propagating from the DUT terminals or DUT connections to the receiver unit are adapted to the stimuli time shifts, so that a temporal alignment of the single DUT output signals can be achieved.

According to other embodiments, the step of receiving at block 110 a temporally aligned superposition of the DUT output signals includes adding the DUT output signals, so that a temporally aligned superposition of the output signals comprises an expected timing and a predetermined threshold value result at the receiver unit if all the DUTs provide identical responses. This means, a certain timing adjustment may be applied to the DUT output signals, i.e. one or more of the output signals may be delayed or the propagation time may be prolonged or shortened compared to other output signals, so that a temporally aligned superposition with an expected timing and a predetermined value results at the receiver unit.

Moreover, the inventive method may comprise a step of comparing the temporally aligned superposition of the DUT output signals at the receiver unit with one or more predetermined threshold values at a strobe time or in a strobe window. This means, the superposed output signals reaching the receiver unit may be compared with a predetermined threshold value at a certain point in time or strobe time or within a strobe window. The superposed signal of the DUT output signals may be checked with respect to its timing and to its level. This may be performed at a certain point in time or strobe time or within a certain time range or strobe window. During such a strobe window the level of a temporally aligned superposed signal must not be lower than a certain threshold value, for example, or it must be within a certain voltage level range, if all DUTs provide identical (but slightly time shifted) output signals.

According to embodiments of the inventive method, the step of comparing the temporally aligned superposition of the DUT output signals may be performed with a predetermined low threshold value and a predetermined high threshold value at the same time (dual-level method). Therefore, a receiver unit may include two comparators in order to compare the received temporally aligned superposition of DUT output signals with a predetermined low level and a predetermined high level at the same time, in order to determine if the superposed output signal is within a certain level or voltage range.

According to another embodiment of the invention, the step of comparing the temporally aligned superposition of the DUT output signals comprises comparing the temporally aligned superposition of the DUT output signals with a predetermined low threshold value and with a predetermined high threshold value, one after the other. In this case, a receiving unit may only comprise one comparator and the temporally aligned superimposed output signal can be measured or evaluated twice in order to compare, for example, first the DUT output signal with the low threshold value and afterwards, i.e. in a serialized way, with a predetermined high threshold value or vice versa (dual-shot method).

When the temporally aligned superposition of the DUT output signals is measured with these dual threshold or dual shot methods, it can be determined if all DUTs give the correct output, i.e. if all DUTs are functionally ok.

The inventive method may furthermore comprise the step of outputting a fail signal or failure if at least one DUT signal from one of the plurality of DUTs does not contribute to the temporally aligned superposition in a predetermined manner, i.e., if it is found that the temporally aligned superposition takes a value which is beyond a predetermined threshold value or which is outside of a pass interval associated to an expected temporally aligned superposition for the case of DUTs providing the expected response. This means, if at least one DUT is malfunctioning and does not contribute to the temporally aligned superposition of DUT output signals or contributes to the temporally aligned superposition in a wrong way in response to a certain stimulus, i.e. with a wrong timing or unexpected output signal level, this can be detected, for example, using a single threshold decision or using two threshold decisions.

The presence of a DUT which is not working correctly in response to a certain stimulus and which, for example, does not react at all, i.e. does not output a signal, or outputs the output signal too early, too late, with incorrect timing or with a signal height deviating from a signal height provided by a correctly working DUT, can be detected by the receiver unit, and hence a failure signal can be generated, which indicates that at least one DUT is faulty.

In some embodiments, further testing can be performed to decide which DUT out of a plurality of DUTs does not provide a correct response. However, this is not required.

It should be noted that according to embodiments, the inventive method, or at least a part thereof, can be performed using a computer program having a program code for performing the methods as described herein.

The above described embodiments are merely illustrative for the principles of the present invention. It is understood that modifications and variations of the arrangement and the details described herein will be apparent to others skilled in the art. It is the intent, therefore, to be limited only by the scope of the pending patent claims and not by the specific details presented by way of description and explanation of the embodiment therein. Although some of the FIGS. 1 to 6 are illustrated as block diagrams of an apparatus, these figures simultaneously are an illustration of a method, where the block functionalities correspond to the method steps.

Depending on certain implementation requirements of the inventive methods, the inventive methods can be implemented in hardware or in software. The implementation can be performed using a digital storage medium, in particular, a disc, a DVD, a CD or Blue-ray having electronically readable control signals stored thereon, which cooperate with programmable computer systems such that the inventive methods are performed. Generally, the present invention is therefore a computer program product with a program code stored on a machine readable carrier, the program code being operated for performing the inventive methods when the computer program product runs on a computer. In other words, the inventive methods are, therefore, a computer program having a program code for performing at least one of the inventive methods when the computer program runs on a computer.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An apparatus for testing a plurality of devices under test (DUTs) comprising:
    a common device output line;
    a driver unit configured to provide a stimulus to said plurality of DUTs, wherein said stimulus reaches different DUTs at different times to create stimuli time shifts at said plurality of DUTs;
    a receiver unit electrically coupled to said common device output line; and
    a plurality of DUT connections electrically coupled to said common device output line wherein DUT terminals of said plurality of DUTs are electrically coupleable via said common device output line to said receiver unit, wherein output signal propagation delays for DUT output signals propagating from said plurality of DUT connections to said receiver unit are adapted to said stimuli time shifts wherein a test of DUTs having analogous stimulus response delays results in a temporally aligned superposition of the DUT output signals at said receiver unit,
    wherein a sum of a first propagation delay from said driver unit to a DUT connection of a respective DUT and of a second propagation delay for a DUT output signal propagating from the DUT connection of the respective DUT to said receiver unit on said common device output line is analogous for all of the plurality of DUTs.

2. The apparatus of claim 1, wherein a sum of a first propagation length from said driver unit to a DUT connection of a respective DUT and of a second propagation length for a DUT output signal propagating from the DUT connection of the respective DUT to the receiver unit is analogous for all of the plurality of DUTs to be tested within a tolerance range of ±5%, ±3%, ±1% or ±0.1%.

3. The apparatus of claim 1, wherein said common device output line is configured wherein arrival times of the DUT output signals which are shifted relative to each other in accordance with said stimuli time shifts at the DUT connections at the receiver unit differ from each other by less than a bit duration or period duration of the DUT output signals.

4. The apparatus of claim 1, wherein said common device output line is configured wherein a constructive superposition of the DUT output signals, which are shifted relative to each other in accordance with said stimuli time shifts at the DUT connections is detectable at the receiver unit.

5. The apparatus of claim 1, wherein said common device output line and said receiver unit are configured wherein digital levels of the DUT output signals provide added DUT output signal levels at the input of the receiver unit in a temporally aligned way.

6. The apparatus of claim 1, wherein said common device output line is configured wherein for DUTs having analogous stimulus response delays, the DUT output signals at said receiver unit comprise relative to each other a temporal deviation of less than a bit duration, which form the temporally aligned superposition of the DUT output signals.

7. The apparatus of claim 1, wherein said driver unit and said receiver unit are configured to be shared by said plurality of DUTs.

8. The apparatus of claim 1, wherein said receiver unit is configured to compare the temporally aligned superposition of the DUT output signals with a predetermined low threshold level and a predetermined high threshold level.

9. The apparatus of claim 1, wherein said receiver unit is configured to compare the temporally aligned superposition of the DUT output signals with a predetermined low threshold level and with a predetermined high threshold level in temporally subsequent cycles.

10. The apparatus of claim 1, wherein said receiver unit is configured to output a fail signal if at least one DUT signal from one of said plurality of DUTs fails to contribute to said temporally aligned superposition in a predetermined manner, wherein the test of a set of non-defective DUTs having analogous stimulus response delays results in an expected temporally aligned superposition of the DUT output signals, and wherein a test of a set of DUTs comprising at least one defective DUT results in an unexpected superposition in which at least one DUT signal does not contribute to the temporally aligned superposition in the predetermined manner.

11. The apparatus of claim 1 further comprising a common device input line electrically coupled to said driver unit, and wherein said driver unit is configured to provide said stimulus via the common device input line to a plurality of input DUT connections to which input DUT terminals of the plurality of DUTs are electrically couple-able.

12. The apparatus of claim 1, wherein said common device output line is configured as a common device input-and-output line electrically coupled to said driver unit at a first end and to the receiver unit at a second end, such that said driver unit provides a stimulus via the common device input-and-output line to said DUT connections and such that DUT output signals propagate from said DUT connections via said common device input-and-output line to said receiver unit.

13. A tester system for testing a plurality of devices under test (DUTs) said system comprising:
 a common device output line;
 a driver unit configured to provide a stimulus to said plurality of DUTs, wherein said stimulus is operable to reach different DUTs at different times creating stimuli time shifts at said DUTs;
 a receiver unit electrically coupled to said common device output line;
 a plurality of DUT connections electrically coupled to said common device output line and operable to be coupled to said plurality of DUTs, wherein a sum of a first propagation delay from said driver unit to a DUT connection of a respective DUT and of a second propagation delay for a DUT output signal propagating from the DUT connection of the respective DUT to said receiver unit on said common device output line is analogous for all of the plurality of DUTs; and
 wherein output signal propagation delays for DUT output signals propagating from said DUT connections to said receiver unit are adapted to said stimuli time shifts wherein a test of the plurality of DUTs having common stimulus response delays results in a temporally aligned superposition of said DUT output signals at said receiver unit.

14. The tester system of claim 13, wherein said common device output line and said receiver unit are configured wherein the digital levels of the DUT output signals provide added digital signal levels at the input of the receiver unit in a temporally aligned way.

15. A method for testing a plurality of devices under test (DUTs) said method comprising:
 applying a stimulus to said plurality of DUTs using a driver unit, such that the stimulus reaches different DUTs at different times creating stimuli time shifts at said DUTs, and wherein said plurality of DUTs provide temporally shifted DUT output signals in response to the stimulus; and
 receiving a temporally aligned superposition of said DUT output signals of said plurality of DUTs at a receiver unit, wherein said plurality of DUTs are operable to be coupled via a common device output line to said receiver unit, and wherein output signal propagation delays for said DUT output signals propagating from terminals of said DUTs to said receiver unit are adapted to the stimuli time shifts providing for the temporal alignment, wherein a sum of a first propagation delay from said driver unit to a DUT connection of a respective DUT and of a second propagation delay for a DUT output signal propagating from the DUT connection of the respective DUT to said receiver unit on said common device output line is analogous for all of the plurality of DUTs.

16. The method of claim 15, wherein the receiving a temporally aligned superposition of said DUT output signals comprises adding said DUT output signals wherein a temporally aligned superposition of said DUT output signals results at the receiver unit.

17. The method of claim 15, further comprising comparing the temporally aligned superposition of said DUT output signals at said receiver unit with one or more predetermined threshold values at a strobe time or in a strobe window.

18. The method of claim 15, further comprising comparing the temporally aligned superposition of said DUT output signals at the same time with a predetermined low threshold value and a predetermined high threshold value, to decide whether there is a defective DUT.

19. The method of claim 15, further comprising subsequently comparing the temporally aligned superposition of the DUT output signals with a predetermined low threshold value and with a predetermined high threshold value.

20. The method of claim 15, further comprising outputting a fail signal, if at least one DUT signal from one of said plurality of DUTs does not contribute to the temporally aligned superposition in a predetermined manner.

* * * * *